(12) United States Patent
Chan et al.

(10) Patent No.: US 6,351,160 B1
(45) Date of Patent: Feb. 26, 2002

(54) METHOD AND APPARATUS FOR ENHANCING RELIABILITY OF A HIGH VOLTAGE INPUT/OUTPUT DRIVER/RECEIVER

(75) Inventors: Francis Chan, Williston; Darin James Daudelin, Essex Junction, both of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/730,980

(22) Filed: Dec. 6, 2000

(51) Int. Cl.[7] .................................................. H03K 3/00
(52) U.S. Cl. ........................ 327/108; 327/112; 327/113
(58) Field of Search ................................. 327/333, 387, 327/388, 389, 391, 309, 330, 108, 113, 112; 326/64, 21, 82, 83, 86

(56) References Cited

U.S. PATENT DOCUMENTS

| 4,789,917 A | 12/1988 | Miller ........................ 174/72 R |
| 4,853,563 A | 8/1989 | Hill et al. ...................... 326/83 |
| 5,555,013 A | 9/1996 | Mori et al. .................. 347/237 |
| 5,631,579 A | 5/1997 | Miki et al. ..................... 326/58 |
| 5,729,157 A | 3/1998 | Monk et al. ................... 326/80 |
| 5,793,592 A | 8/1998 | Adams et al. ................. 361/90 |
| 5,852,375 A | 12/1998 | Byrne et al. ................ 327/108 |
| 5,903,179 A | * 5/1999 | Kim ............................ 327/309 |
| 5,933,382 A | 8/1999 | Yi et al. ................... 365/225.7 |
| 5,969,563 A | * 10/1999 | Shih et al. ................... 327/333 |
| 6,043,678 A | 3/2000 | Watarai ........................ 326/64 |
| 6,043,687 A | * 3/2000 | Watarai ........................ 326/64 |
| 6,064,231 A | 5/2000 | Kothandaraman et al. .... 326/83 |

FOREIGN PATENT DOCUMENTS

EP          0 171 495 B1    9/1989

* cited by examiner

Primary Examiner—Tuan T. Lam
Assistant Examiner—Hiep Nguyen
(74) Attorney, Agent, or Firm—Richard A. Henkler; Bracewell & Patterson, L.L.P.

(57) ABSTRACT

A method and apparatus for enhancing reliability of a high voltage input/output (I/O) driver/receiver reduces voltage stress on transistors forming part of a logic I/O driver/receiver. The driver/receiver is designed to handle voltages greater than the power supply rails and a bias circuit reduces the voltage stress present on the output stage when a power supply voltage is removed from the circuit. The bias circuit is driven by I/O pin voltage to control a transistor within the I/O logic ladder.

20 Claims, 4 Drawing Sheets

METHOD AND APPARATUS FOR ENHANCING RELIABILITY OF A HIGH VOLTAGE INPUT/OUTPUT DRIVER/RECEIVER

BACKGROUND OF THE INVENTION

1. Technical Field

The present invention relates generally to integrated circuits, and more particularly, to integrated circuits having a high-voltage input/output driver/receiver.

2. Description of the Related Art

Input/output (I/O) drivers interconnect integrated circuits in larger circuits and systems. High-voltage I/O drivers are used in designs wherein an I/O pin of an integrated circuit may experience voltages higher than the power supply rail supplying output driver transistors. High-voltage I/O driver/receivers must be designed to operate in the presence of these higher voltages.

Power management systems in computers, personal digital assistants (PDAs) and other battery powered or power sensitive applications may selectively power-down portions of the electronics. When an integrated circuit is powered down, other integrated circuits may still be powered and may impress voltages on the pins of the powered-down integrated circuit. These voltages can cause damage to the transistors within the integrated circuit, not only by excessive current that may destroy the transistors causing failure of the integrated circuit, but by over-stressing the transistors with gate-to-source voltages in excess of safe margins.

Over-stressing a transistor reduces the mean-time-before-failure (MTBF) of the transistor and therefore the MTBF of the overall integrated circuit. Since an individual I/O driver/receiver circuit may be repeated hundreds of times within an integrated circuit and output driver transistors typically contribute greatly to the overall reliability equation, the MTBF is dramatically affected by the design of I/O driver/receivers.

Over-stressing a transistor over time also causes changes in the threshold voltage of the transistor. Changes in the threshold voltage of an output driver transistor affect the switching point of the transistor and therefore the transition time and propagation delay of the output.

In light of the foregoing, it would be desirable to provide a method and apparatus for enhancing the reliability of a high voltage I/O driver/receiver. It would further be desirable to provide a method and apparatus that reduce variations in the transition time and propagation delay of an output driver.

SUMMARY OF THE INVENTION

The objective of enhancing the reliability of a high-voltage I/O driver/receiver and reducing variations in propagation delay and transition time are accomplished in a method and apparatus that reduce stresses in I/O driver/receiver transistors when power is removed from a power supply rail. The circuit has a control transistor coupled to an I/O pad of the I/O driver/receiver for isolating one or more transistors within the I/O driver/receiver and a bias network coupled to the gate of the control transistor and also coupled to the I/O pad so that the bias network produces a bias for the control transistor one diode drop or less from the voltage on the I/O pad.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like reference numerals indicate like components, and:

DESCRIPTION OF AN ILLUSTRATIVE EMBODIMENT

Figure 1:
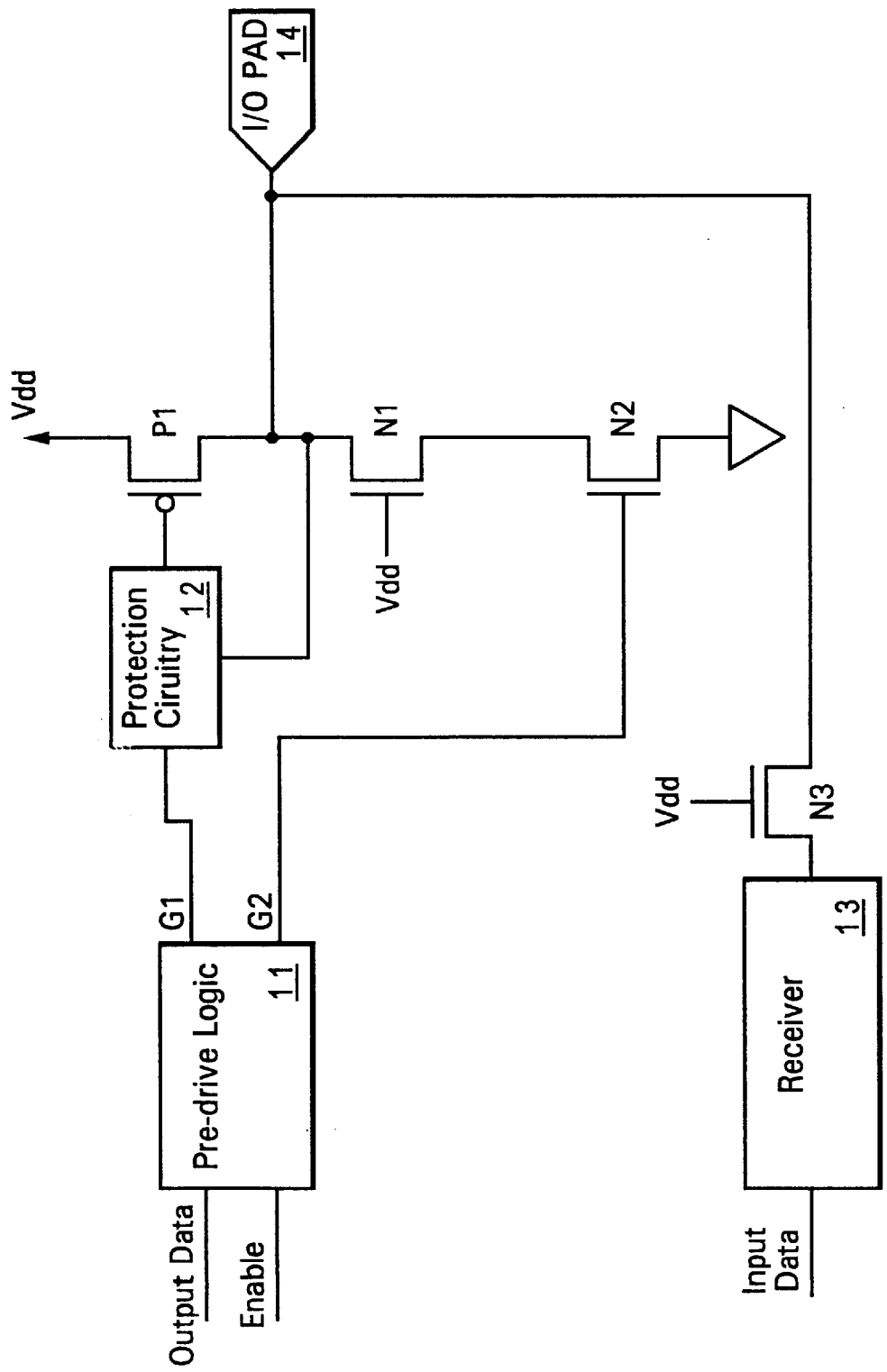
FIG. 1 is a block diagram of a prior art I/O driver/receiver circuit.

With reference now to the figures, and in particular with reference to FIG. 1, a prior art I/O driver/receiver is depicted. Pre-drive logic 11 provides control signals G1 and G2 for the gates of transistors P1 and N2, respectively. Protection circuitry 12 provides protection for transistor P1 so that transistor P1 is not damaged when the voltage on I/O pad 14 exceeds the voltage on Vdd. The I/O driver/receiver is set to the input or tri-state output state when Enable input is in the deactivated state. Pre-drive logic 11 accomplishes this by setting output G1 to Vdd and output G2 to ground, ensuring that the output stage formed by transistor P1 and transistor N2 will not conduct.

Transistor N1 protects transistor N2 from high voltages that may be imposed on I/O pad 14. The voltage on I/O pad 14 will be divided between transistor N1 and transistor N2, providing that voltages in excess of Vdd will appear across transistor N1. However, when Vdd is removed from the circuit, transistor N1 experiences a gate-source voltage that is equal to the voltage present on I/O pad 14. This voltage can be higher than Vdd if the driver/receiver is used in a circuit where higher-voltage logic is coupled to same node, or where the driver/receiver is used on a long circuit line where reflections produce overshoot that can approach twice the output voltage. The high gate-source voltage causes stresses that reduce the reliability of transistor N1, and in some cases cause immediate failure. For example, a 0.6V overstress of transistor N1 may cause a reduction in reliability of an integrated circuit from 100,000 hours MTBF to 10,000 hours. This represents an expected lifetime of only one year in a circuit that would otherwise yield a ten year lifetime.

A receiver 13 is coupled to I/O pad 14 by transistor N3. Receiver 13 detects the voltage at I/O pad 14 for use as input data. Transistor N3 protects receiver 13 from voltages appearing on I/O pad 14 in excess of Vdd, preventing damage to receiver 13. However, transistor N3 is subject to the same overstress condition when Vdd is removed as described for transistor N1, above, since its gate is likewise tied to Vdd.

Figure 2:
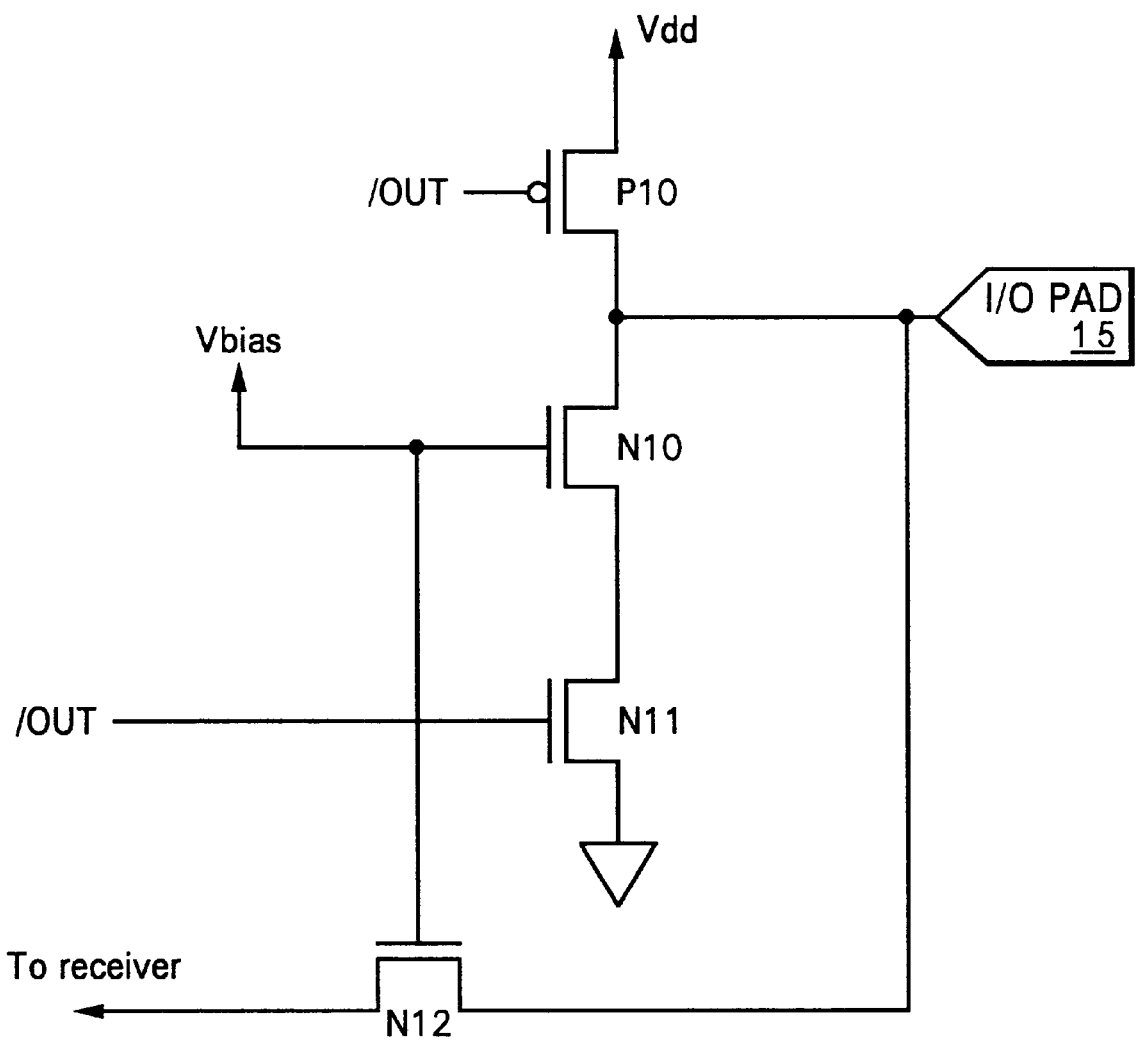
FIG. 2 is a schematic diagram of an I/O driver/receiver in accordance with a preferred embodiment of the invention.

Referring now to FIG. 2, there is depicted a schematic diagram of an output driver in accordance with a preferred embodiment of the invention. Transistors N1 and P10 control the logic behavior of the output stage and transistor N10 is provided to isolate transistor N11 when power is removed from the output driver. Transistor N12 couples I/O pad 15 to a receiver circuit (optional).

Vbias is a bias voltage that controls the operation of isolation transistor N10. Prior designs have coupled Vbias to Vdd. This turns transistor N10 on when Vdd is present, allowing the logic gate as a typical push-pull output. When Vdd is removed in prior designs, transistor N10 will turn off, preventing transistor N11 from conducting current from I/O pad 15. This prevents excess power dissipation in transistor N11 as well as reducing power-down losses in circuits where powered circuits are coupled to I/O pad 15. Transistor N12 is controlled by Vbias to prevent damage to a receiver circuit from voltages imposed on I/O pad 15 in excess of Vdd.

The prior designs have a disadvantage in that transistors N10 and N12 are overstressed by voltages imposed on I/O pad 15 when Vdd is removed (causing the Vdd nodes to be at ground potential) or when Vdd falls sufficiently below a voltage imposed on I/O pad 15. Overshoot present due to long lines connected to A/C signals that may be present on I/O pad 15 increase the stress on transistors N10 and N12. The present invention controls Vbias to produce a desired voltage at the gates of transistors N10 and N12 both when Vdd is present and when Vdd is removed. The voltage is less than or equal to one diode drop, reducing the stress on transistors N10 and N12, while keeping them turned off.

Table 1 illustrates the desired operation of Vbias to protect isolation transistors N10 and N12 in the presence of voltages as high as 2.4V on I/O pad 15 with and without Vdd applied to the circuit. When Vdd is present, Vbias should be held at Vdd. When Vdd is removed and I/O pad 15 has a voltage present, Vbias is held at a voltage approximating the value of Vdd that is present during normal operation (in this case 1.8V).

TABLE 1

| Vdd | I/O pad | Vbias |
| --- | --- | --- |
| removed (0 V) | 0 V | (don't care) |
| removed (0 V) | 2.4 V | ≅ 1.8 V |
| present (1.8 V) | 0 V | Vdd (1.8 V) |
| present (1.8 V) | 2.4 V | Vdd (1.8 V) |

Figure 3:
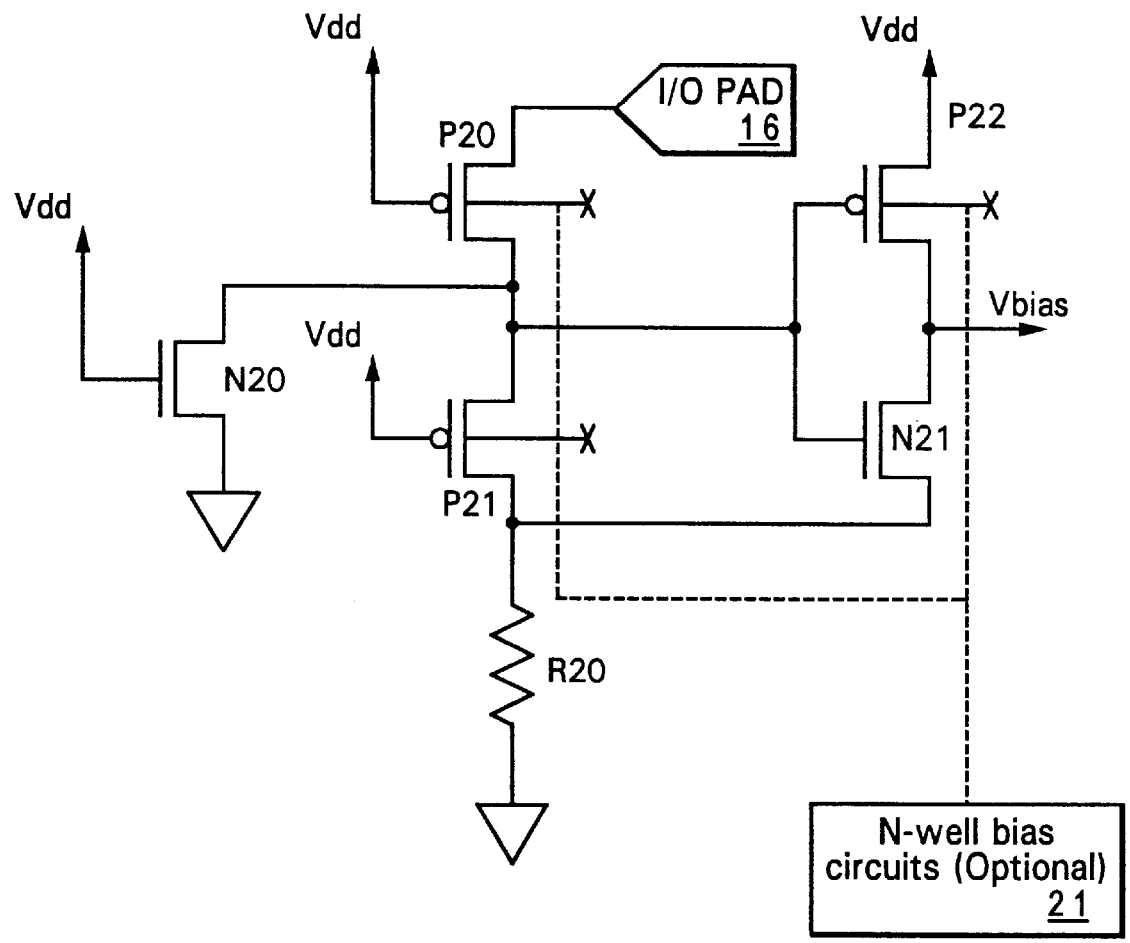
FIG. 3 is a schematic diagram of a bias circuit in accordance with a preferred embodiment of the invention.

Referring now to FIG. 3, a schematic diagram of a bias circuit in accordance with a preferred embodiment of the invention is depicted. Transistor P22 couples Vdd to Vbias when Vdd is present, since transistor N20 will be activated, pulling the gate of transistor P22 to ground. When Vdd is removed, transistors P20 and P21 will conduct a voltage present on I/O pad 16 to resistor R20 and transistor N21 will conduct, coupling the voltage at the junction of resistor R20 and transistor P21 to Vbias. Transistors P20 and P21 are isolated by floating N-wells, preventing static leakage and eliminating the need to derive a bias for the N-well from I/O pad 16 when Vdd is removed, since the channel-well junction will forward bias if the wells are not held near the channel potential. An optional biasing circuit 21 may be used to control the bias of the N-wells. Transistor N21 provides a voltage drop of one diode drop, causing the circuit to perform as described in Table 1. The value of resistor R20 and the characteristics of transistors P20 and P21 are chosen so that the voltage on I/O pad 15 is divided to produce a voltage at Vbias that is approximately the design value of Vdd when the circuit is powered.

Figure 4:
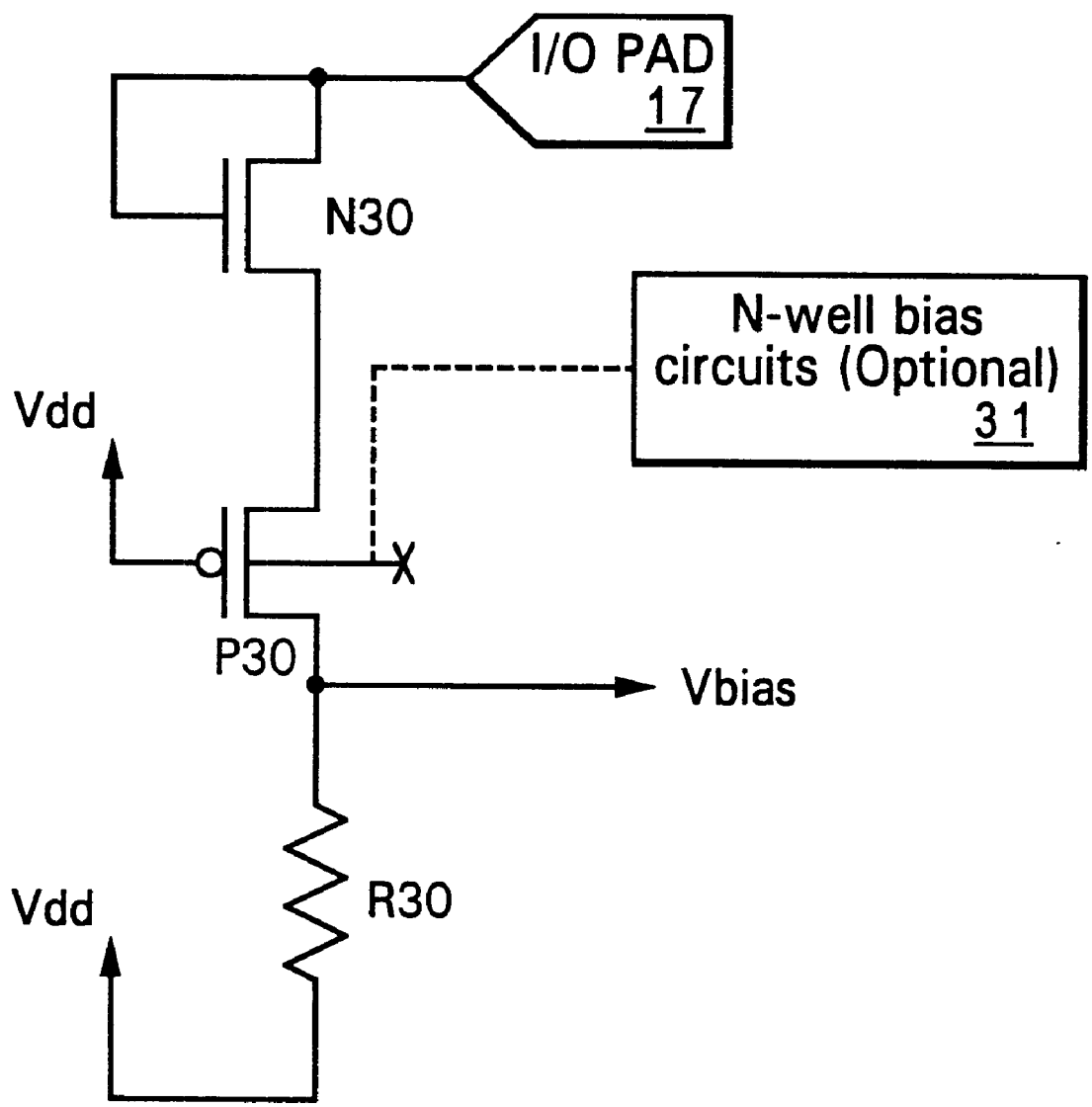
FIG. 4 is a schematic diagram of a bias circuit in accordance with an alternative embodiment of the invention.

Referring now to FIG. 4, a schematic diagram of a bias circuit in accordance with an alternative embodiment of the invention is depicted. Transistor P30 is turned off when Vdd is present, but turns on when Vdd is removed. When transistor P30 is off, the voltage at Vbias will be held at Vdd by resistor R30 and when transistor P30 is on, a voltage on I/O pad 17 will be coupled to Vbias. Transistor N30 provides a voltage drop of one N-channel threshold device, causing the circuit to perform as described in Table 2. Transistor P30 is isolated by an N-well that can be floating or biased via an optional n-well bias circuit 31.

TABLE 2

| Vdd | I/O pad | Vbias |
| --- | --- | --- |
| removed (0 V) | 0 V | (don't care) |
| removed (0 V) | 2.4 V | 2.4 V − $V_{TN}$ |
| present (1.8 V) | 0 V | Vdd (1.8 V) |
| present (1.8 V) | 2.4 V | Vdd (1.8 V) |

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. It is therefore contemplated that such modifications can be made without departing from the spirit or scope of the present invention as defined in the appended claims.

What is claimed is:

1. An output driver circuit comprising:
   an output pad;
   a control transistor having a first terminal coupled to said output pad and a second terminal coupled to at least one logic transistor for isolating said at least one logic transistor from said output pad; and
   a bias network having an output coupled to a gate of said control transistor and an input coupled to said output pad, wherein said bias network output produces a voltage that is approximately equal to a power supply rail voltage of said output driver circuit, such that stresses on said control transistor are reduced when power is removed from said power supply rail and an external voltage is impressed on said output pad.

2. The output driver circuit of claim 1, wherein said output pad is a bidirectional signal pad, and wherein said output driver circuit further comprises:
   a second control transistor having a gate coupled to said bias network output and a first terminal coupled to said bidirectional signal pad; and
   a receiver circuit coupled to a second terminal of said second control transistor.

3. The output driver circuit of claim 1, wherein said bias network comprises a complementary pair of transistors having gates coupled to a terminal of a switching transistor, wherein said switching transistor has a gate coupled to said power supply rail, such that one of said complementary pair of transistors is enabled when said power supply rail is coupled to a power source.

4. The output driver circuit of claim 3, wherein a first one of said complementary pair of transistors is an N-channel transistor and wherein said first one of said complementary pair of transistors has a first terminal coupled to said power supply rail and a second terminal coupled to a second one of said complementary pair of transistors, wherein said second one of said complementary pair of transistors is a P-channel transistor.

5. The output driver circuit of claim 3, wherein said bias network further comprises a divider chain having a first and second divider transistor having gates coupled to said power supply rail for enabling said divider chain when power is removed from said power supply rail, and wherein said first divider transistor has a first terminal coupled to said output pad and a second terminal coupled to a first terminal of said second divider transistor and said gates of said complementary pair of transistors.

6. The output driver circuit of claim 5, wherein said first and second divider transistors are P-channel transistors, and said power supply rail is a positive rail.

7. The output driver circuit of claim 5, wherein said divider chain further comprises a resistor having a first terminal coupled to a second terminal of said second divider transistor and a second terminal coupled to ground for producing a current through said divider chain.

8. The output driver circuit of claim 7, wherein said first terminal of said resistor is coupled to a first terminal of a first one of said complementary pair of transistors and a second terminal of said first one of said complementary pair of transistors is coupled to a terminal of a second one of said complementary pair of transistors.

9. The output driver circuit of claim 8, wherein said output pad is a bidirectional signal pad, and wherein said output driver circuit further comprises:
   a second control transistor having a gate coupled to said bias network output and a first terminal coupled to said bidirectional signal pad; and
   a receiver circuit coupled to a second terminal of said second control transistor.

10. The output driver circuit of claim 1, wherein said bias network comprises first transistor having a gate and a first terminal coupled to said output pad and a second transistor having a gate coupled to said power supply rail, a first terminal coupled to a second terminal of said first transistor and a second terminal coupled to said output of said bias network.

11. The output driver circuit of claim 10, wherein said first transistor is an N-channel transistor.

12. The output driver circuit of claim 11, wherein said second transistor is a P-channel transistor and said power supply rail is a positive rail.

13. The output driver circuit of claim 10, further comprising a resistor having a first terminal coupled to said output of said bias network and a second terminal coupled to said power supply rail for setting the voltage of said output of said bias network to the power supply rail when said power supply rail is coupled to a power source.

14. The output driver circuit of claim 13, wherein said output pad is a bidirectional signal pad, and wherein said output driver circuit further comprises:
   a second control transistor having a gate coupled to said bias network output and a first terminal coupled to said bidirectional signal pad; and
   a receiver circuit coupled to a second terminal of said second control transistor.

15. An output driver circuit, comprising:
   an output pad;
   a control transistor having a first terminal coupled to said output pad and a second terminal coupled to at least one logic transistor for isolating said at least one logic transistor from said output pad; and
   a bias network having an output coupled to a gate of said control transistor and an input coupled to said output pad, wherein said bias network comprises
      a complementary pair of transistors having gates coupled to a terminal of a switching transistor, wherein said switching transistor has a gate coupled to said power supply rail, such that one of said complementary pair of transistors is enabled when said power supply rail is coupled to a power source, and
      a divider chain having a first and second divider transistor having gates coupled to said power supply rail for enabling said divider chain when power is removed from said power supply rail, and wherein said first divider transistor has a first terminal coupled to said output pad and a second terminal coupled to a first terminal of said second divider transistor and said gates of said complementary pair of transistors.

16. The output driver circuit of claim 15, wherein said divider chain further comprises a resistor having a first terminal coupled to a second terminal of said second divider transistor and further coupled to a first terminal of a first one of said complementary pair of transistors, and wherein said resistor has a second terminal coupled to ground for producing a current through said divider chain.

17. An output driver circuit comprising:
   an output pad;
   a control transistor having a first terminal coupled to said output pad and a second terminal coupled to at least one logic transistor for isolating said at least one logic transistor from said output pad; and
   a bias network having an output coupled to a gate of said control transistor and an input coupled to said output pad, wherein said bias network comprises
      a first transistor having a gate and a first terminal coupled to said output pad, and
      a second transistor having a gate coupled to said power supply rail, a first terminal coupled to a second terminal of said first transistor and a second terminal coupled to said output of said bias network.

18. The output driver circuit of claim 17, further comprising a resistor having a first terminal coupled to said output of said bias network and a second terminal coupled to said power supply rail for setting the voltage of said output of said bias network to the power supply rail when said power supply rail is coupled to a power source.

19. A method for reducing stresses in an output driver when voltage is removed from a power supply rail, wherein said circuit has an output pad coupled to an isolation transistor, said method comprising the steps of:
   responsive to voltage at said power supply rail, setting a gate of an isolation transistor to said power supply rail; and
   responsive to voltage absent from said power supply rail, conducting a second voltage from said output pad to said gate of said isolation transistor, such that said gate of said isolation transistor is biased at a voltage approximately equal to said power supply rail voltage.

20. The method of claim 19, further comprising the steps of:
   dividing said second voltage in response to determining that said voltage is removed from said power supply rail; and
   biasing said isolation transistor in conformity with said divided voltage.

* * * * *